(12) United States Patent
Cooper et al.

(10) Patent No.: US 10,879,896 B2
(45) Date of Patent: Dec. 29, 2020

(54) CAPACITIVE PROXIMITY SENSOR IN A MOBILE DEVICE AND METHOD OF LIMITING RADIATION ABSORPTION

(71) Applicant: Semtech Corporation, Camarillo, CA (US)

(72) Inventors: Tim Cooper, Mouthe (FR); Chaouki Rouaissia, Neuchâtel (CH)

(73) Assignee: Semtech Corporation, Camarillo, CA (US)

( * ) Notice: Subject to any disclaimer, the term of this patent is extended or adjusted under 35 U.S.C. 154(b) by 0 days.

(21) Appl. No.: 15/673,040

(22) Filed: Aug. 9, 2017

(65) Prior Publication Data
US 2018/0069549 A1 Mar. 8, 2018

(30) Foreign Application Priority Data
Sep. 7, 2016 (EP) .................... 16187551

(51) Int. Cl.
G06F 3/044 (2006.01)
H03K 17/955 (2006.01)
G06F 3/01 (2006.01)
H04M 1/02 (2006.01)

(52) U.S. Cl.
CPC ........... H03K 17/955 (2013.01); G06F 3/017 (2013.01); G06F 3/044 (2013.01); H04M 1/026 (2013.01); H04M 2250/12 (2013.01)

(58) Field of Classification Search
CPC combination set(s) only.
See application file for complete search history.

(56) References Cited

U.S. PATENT DOCUMENTS

| | | | |
|---|---|---|---|
| 2004/0178997 A1* | 9/2004 | Gillespie | G06F 3/03547 345/173 |
| 2006/0250142 A1* | 11/2006 | Abe | H03K 17/955 324/663 |
| 2012/0214412 A1* | 8/2012 | Schlub | G01B 7/023 455/41.1 |
| 2013/0169348 A1* | 7/2013 | Shi | H04B 1/3838 327/517 |
| 2014/0002305 A1 | 1/2014 | Hsu et al. | |
| 2014/0213323 A1* | 7/2014 | Holenarsipur | H03K 17/955 455/566 |
| 2014/0315592 A1* | 10/2014 | Schlub | H04B 1/3838 455/522 |

FOREIGN PATENT DOCUMENTS

| | | |
|---|---|---|
| EP | 2876407 A1 | 5/2015 |
| EP | 2988479 A1 | 2/2016 |

* cited by examiner

*Primary Examiner* — Temesghen Ghebretinsae
*Assistant Examiner* — Sosina Abebe
(74) *Attorney, Agent, or Firm* — Blank Rome LLP

(57) ABSTRACT

A proximity sensor for detecting proximity of a body portion to a mobile device, comprising: a plurality of capacitive sensing electrodes for detecting said body portion, an electronic processing circuit arranged for measuring the capacities of said capacitive sensing electrodes and for generating a proximity signal based on the capacities so measured, wherein the capacitive sensing electrodes are connected together by one or more capacitive elements, and at least one capacitive sensing electrode is connectable to a radio circuit of said mobile device so as to constitute a radiofrequency antenna of said mobile device.

12 Claims, 3 Drawing Sheets

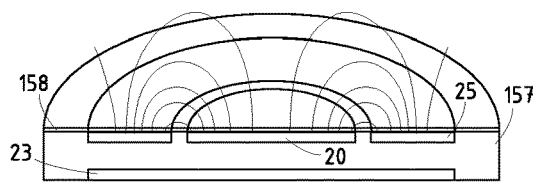
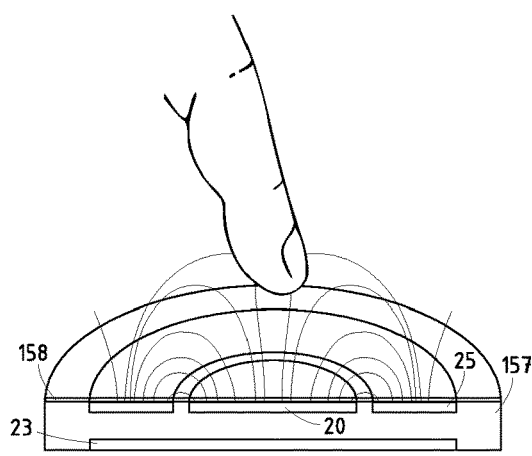
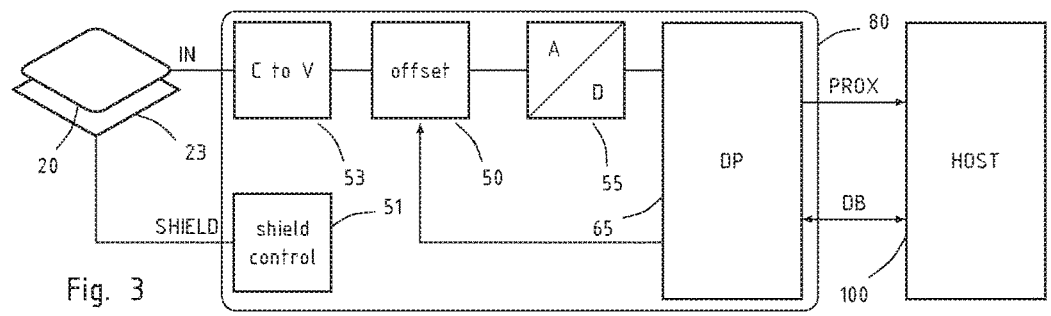
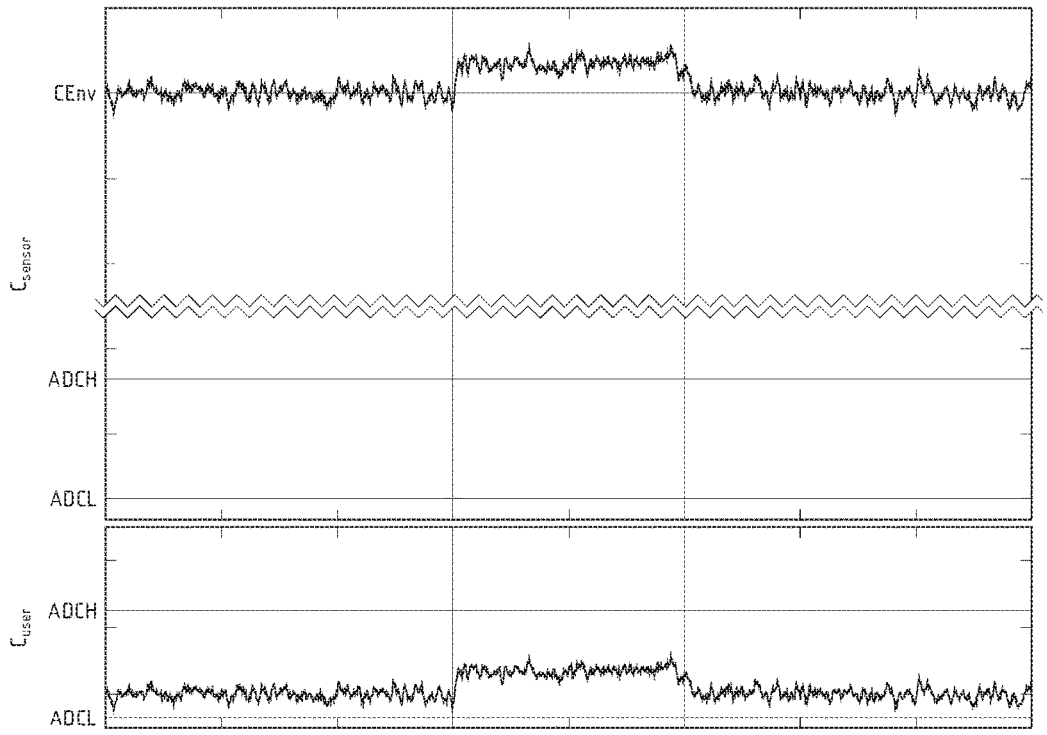

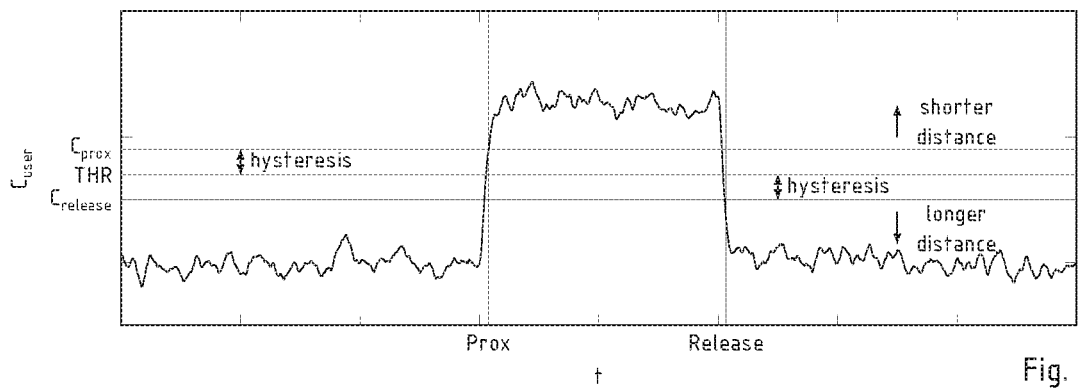
Fig. 5
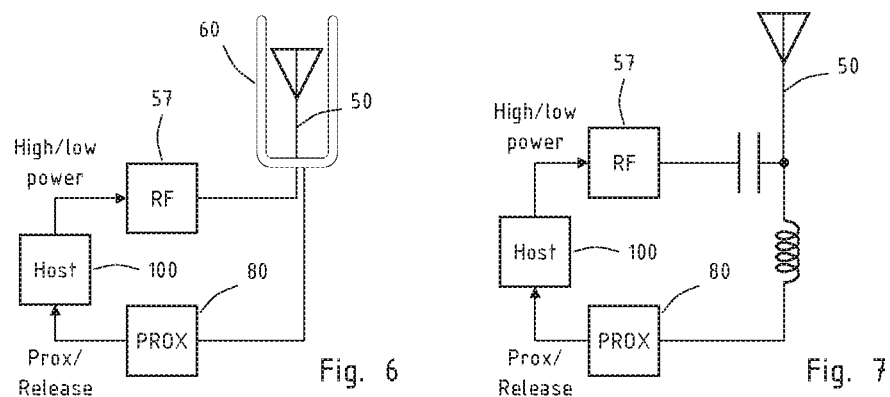
Fig. 6
Fig. 7
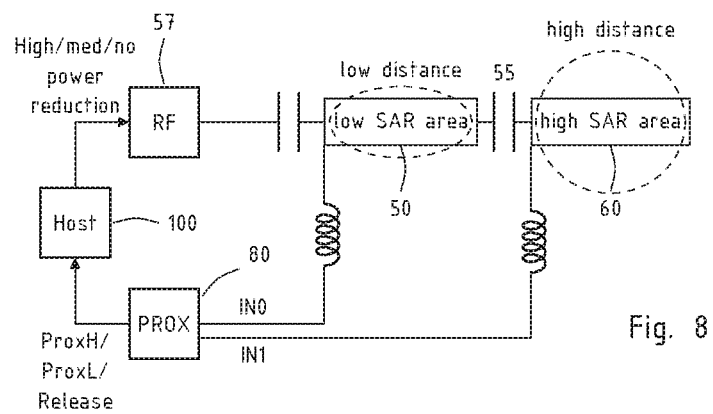
Fig. 8

CAPACITIVE PROXIMITY SENSOR IN A MOBILE DEVICE AND METHOD OF LIMITING RADIATION ABSORPTION

REFERENCE DATA

The present application claims priority of European Patent application EP16187551.3 of Sep. 7, 2016, the contents whereof are hereby incorporated in their entirety.

FIELD OF THE INVENTION

The present invention concerns a proximity sensor and a method for detecting the proximity of a body portion. Embodiments of the present invention concern in particular portable devices like cell phones that, being equipped with the inventive sensor are capable of detecting the proximity of body parts and discriminate the direction whence the detected body part is approaching.

DESCRIPTION OF RELATED ART

It is often desired to detect whether a body portion is at short distance of an apparatus. In the particular case of cell phones and wirelessly connected mobile device, (including tablets and other similar terminals). This form of proximity detection can be used as an input to the apparatus, but, for RF-emitting devices, it is known to use a proximity indication to adapt the instantaneous RF power, in order to comply with SAR (Specific absorption Ratio) regulations. SAR is a measure of the amount of RF energy radiated in the human body when in close proximity to a radio emitting device (phone, tablet, laptop, etc.).

Sensors arranged for detecting a body near to an object, including inductive, optical, heat, and capacitive based sensors, are known. In the cell phone market, the most common method today is the infrared optical detection that has a good range and directivity. The main drawbacks of the optical system are its power consumption, the cost of its components and of its integration in the phone and the size needed to implement the solution on the phone surface.

Capacitive sensors have a lower power consumption, require only a small area or no area on the phone surface and have a lower cost. They are however quite omnidirectional and therefore tends to generate lots of false positives, i.e. detection of body portions from irrelevant directions. This risk of false detection could be reduced by reducing severely the range of detection.

An example of capacitive sensor for proximity sensing in a mobile communication device is described in patent application EP2988479, in the name of the applicant, whose content is hereby included by reference.

In devices that are equipped with a RF antenna, for example a mobile cellular phone, it is known to use the antenna itself as capacitive sense electrode. In this case the antenna is connected both to the RF front-end and to a proximity detection circuit. Capacitors and inductors are used to keep the RF frequency domain isolated from the low frequencies typically used for capacitive proximity detection.

In this approach it is important that the capacitive detection system operates reliably, with a high immunity from RF, and with a minimal impact to the radio system.

BRIEF SUMMARY OF THE INVENTION

It is therefore an aim of the invention to provide a method and sensor based on a capacitive sensor and which has an improved direction discrimination, and can operate together with a radiofrequency antenna.

According to an aspect of the invention, these aims are achieved by the objects of the appended claims, in particular by a proximity sensor for detecting proximity of a body portion to a mobile device, comprising: a plurality of capacitive sensing electrodes for detecting said body portion, an electronic processing circuit arranged for measuring the capacities of said capacitive sensing electrodes and for generating a proximity signal based on the capacities so measured, wherein the capacitive sensing electrodes are connected together by one or more capacitive elements, and at least one capacitive sensing electrode is connectable to a radio circuit of said mobile device so as to constitute a radiofrequency antenna of said mobile device.

The proximity sensor of the invention may foresee inductive coupling between the sensing electrode and the processing circuit, and capacitive coupling between the electrodes and the radio unit. Furthermore, the electronic processing circuit is preferably arranged to reject events characterized by a change of the capacitance seen by any one of the capacitive sensing electrodes with a speed exceeding a given threshold value.

The detection algorithm may involve detection of a step change between a first and a second essentially constant values of capacity and, should several electrodes be measured, generate a proximity value based on a weighted sum of the capacities, or of the variations of capacitance measured from the capacitive sensing electrodes, possibly leading to the generation of a directional proximity value.

The invention also comprises a mobile device, with the proximity sensor specified above, in combination with a radio unit connected to a radiofrequency antenna for receiving and/or transmitting radio signal, the capacitive sensing electrode or electrodes of the proximity sensor constituting the radiofrequency antenna. Preferably the proximity sensor has a plurality of capacitance inputs, each coupled to a section of the radiofrequency antenna. The radio unit may be arranged to communicate in the UHF spectrum, in particular in a band of the UHF spectrum assigned to cellular phone services, Wi-Fi, or Bluetooth. The sections of the antenna are preferably conductive areas laminated on an insulating circuit board.

An independent aspect of the present invention relates to a proximity sensor for detecting proximity of a body portion to a mobile device, comprising: at least one capacitive sensing electrode for detecting said body portion, an electronic processing circuit arranged for measuring the capacities of said capacitive sensing electrode and for generating a proximity signal based on the capacities so measured, wherein electronic processing circuit is arranged to reject events characterized by a change of the capacitance seen by any one of the capacitive sensing electrodes with a speed exceeding a given threshold value, possibly in combination with any of the features and limitations specified above.

BRIEF DESCRIPTION OF THE DRAWINGS

The invention will be better understood with the aid of the description of an embodiment given by way of example and illustrated by the figures, in which:

FIGS. 1 and 2 show the electric field distribution around a proximity detector in free space, and in presence of an approaching body part.

FIG. 3 illustrates schematically a capacitive proximity detector

FIG. 4 plots the capacitance variations of a proximity detector.

FIG. 5 plots a discrimination scheme.

FIG. 6 shows a known disposition of a capacitive proximity detector in which the capacitive electrode, is placed around or close to the RF antenna but separated from it.

FIG. 7 shows a disposition in which the antenna itself is used as sensor. Capacitors and inductors are used to separate the RF signals from the LF signals used for capacitive detection.

FIG. 8 shows an inventive disposition in which the antenna is segmented.

DETAILED DESCRIPTION OF POSSIBLE EMBODIMENTS OF THE INVENTION

Figure 9:
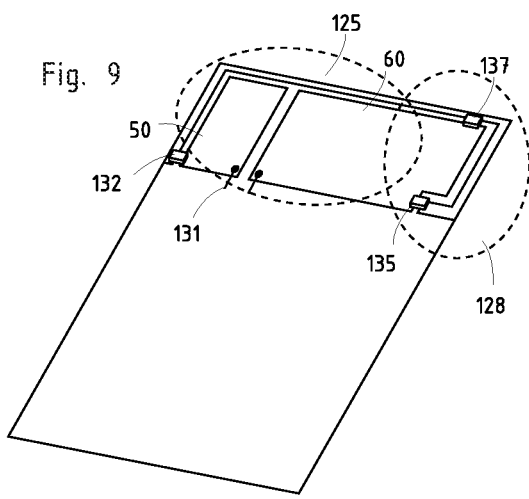
FIGS. 9 and 10 illustrate a variant of the invention in which a 890 MHz GSM antenna is used as segmented capacitive detector, in a cellphone and the anisotropy in the electric field emitted by the antenna.

Although the present invention is applicable to vast array of devices including, but not limited to, cell phones, tablets, and laptop computers, examples of this description may refer simply to a phone. This should not be construed as a limitation of the invention, but merely as an example focusing on a particular implementation for concision's sake.

The functioning of a capacitive proximity detector suitable for the invention will now be recalled referring to figures. As illustrated in FIG. 1, capacitive sensors may use, as sense electrode, a conductive layer 20 on a printed circuit board or PCB 157. In the example, the electrode 20 is surrounded by a grounded ring 25, backed by a shield electrode 23, and covered by a dielectric overlay 158, but none of these features is essential, as the shape that can be round, as shown or any other shape. In free space, far from other conductive bodies, the capacitance of the sense electrode will have a baseline value: $C_{sensor}=C_{env}$, determined from the electric induction between the electrode and all the surrounding conductors.

A conductive body in the proximity of the sensor, as shown in FIG. 2, modifies the electric field distribution and, in general, induce an increase of the capacitance of the sense electrode: $C_{sensor}=C_{env}+C_{user}$.

It is well to realize that the increase $C_{user}$ may be much less than the base capacitance $C_{env}$. In a typical case, $C_{user}$ may be 1% of $C_{env}$, or even less. On the other hand, $C_{env}$ is hard to predict or simulate reliably, because it depends from several uncontrollable effects. Nevertheless, $C_{user}$ can be estimated by the formula below $$C_{User} = \frac{\varepsilon_0 \varepsilon_r A}{d}$$

where A is the common area between the two electrodes, hence the common area between the user's finger/palm/face and the sensor electrode 20, d their distance, and $\varepsilon_0$, $\varepsilon_r$ denote the absolute and relative dielectric permittivity. Conductive effects are neglected.

Figure 12:
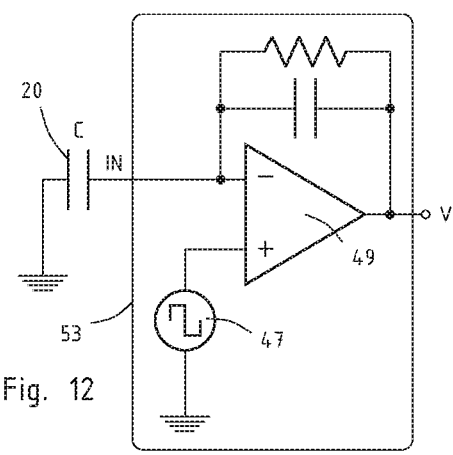
FIG. 12 is a simplified idealized circuit for converting capacitance to voltage.

FIG. 3 shows schematically the structure of a capacitance proximity detector, as it could be employed in the frame of the invention. The detector includes a sense electrode 20 connected to an input terminal IN for the determination of its capacitance. The capacitance of the electrode can be determined by applying a variable potential of determined amplitude V to the input terminal IN, integrating the input current to obtain the electric charge Q, which is related to the capacitance by $C=Q/V$. The input potential can vary according a sinusoidal or square law, for example. FIG. 12 shows a simplified circuit that could be used for the purpose, as described in EP2876407, but other circuits fulfilling the same function are available and comprised in the frame of the invention. The informed reader will recognize that the terminal IN is a low impedance node whose potential is the same, thanks to reaction of amplifier 49, as the output of the voltage source 47, and that the output signal V has the same shape as that of the source 47, with an amplitude proportional to the capacitance 20. For additional information, the reader is directed to patent application EP2876407, which is hereby incorporated by reference.

As mentioned above, the capacitance change $C_{user}$ determined by the proximity of the user is superposed to a large baseline value $C_{env}$ that is constant, or drifts slowly. The sensor of the invention includes preferably an offset subtraction unit 50 that is arranged to subtract a programmable value to the total capacitance before it is converted to a digital value in the ADC 55, to enhance the proximity induced variations and utilize optimally the dynamic range of the latter.

FIG. 4 illustrates the action of the offset subtraction unit 50. The upper plot shows how the total capacitance $C_{sensor}$ varies when a conductive body approaches the sensor (t=Prox) and then moves away (t=Release). The total capacitance $C_{sensor}$ is centered around $C_{env}$ and is outside the dynamic range of the ADC (ADCL-ADCH). The lower plot shows the effect of setting the offset subtraction unit such that it $C_{env}$ is subtracted, and at the input of ADC 55 is present a signal $C_{user}=C_{sensor}-C_{env}$. The signal is contained in the ADC range (ADCL-ADCH).

In the drawing, the offset compensation unit 50 is represented as a separate block acting on an analogue signal generated by the capacitance-to-voltage converter 53. Although this is a possible and favored implementation, it is not the only one; the invention is not limited to this embodiment, and the blocs of the schematics 1 should be interpreted as functional elements rather than physically separated entities. In variants, the subtraction of the offset could be carried out in the capacitance-to-voltage converter 53, or in the ADC 55. Also, if the proximity detector 80 comprises several input channels, as it will be detailed further, the offset compensation could be done in independent units for each channel, or in a shared compensation circuit.

Besides the capacitance $C_{env}+C_{user}$ the input electrode 20 can pick up all sort of signals and disturbances generated in its environment, including those coming from the phone in which it is embedded. Although such unwanted contributions can be filtered by signal processing, it is preferable to attenuate them from the start. To this purpose, the detector may provide a shield electrode 23, below the sense electrode 20, in order to screen it from the electronics inside the phone. Preferably, the sense electrode is connected to the output terminal, of a shield control unit 51, which follows the variable potential of the input terminal IN. In this manner, the shield 23 does not contribute to the capacitance $C_{env}$ seen by the electrode 20.

Digital processor 65 elaborates the digital signal generated by the ADC 55 and provides a proximity signal PROX based on the capacitance of the electrode 20. It is in communication with a host system 100, for example a mobile phone through a bus DB, and can be implemented by any form of wired or programmable logic. The digital processor 65 takes care of functions like fine offset subtraction, noise filtering, and implements a decision algorithm that asserts the PROX signal when the capacitance read at the input IN is compatible with a part of a user's body in proximity.

Although FIG. 3 represents only one input terminal, the sensor of the invention is not so limited and could in fact include a plurality of capacitance-sensitive input terminals, in which case the function blocks described above (C-V conversion, offset subtraction, A/D conversion) may be embodied by fully independent channels, or else some functions may be multiplexed across several input channels.

FIG. 5 illustrates the operation of a simple discriminator with that can be used in the frame of the invention to determine whether the body in proximity. The signal $C_{user}$ is the capacitance seen by the electrode after subtraction of the baseline $C_{env}$. The proximity flag is set when $C_{user}$ exceed the value $C_{prox}$, and reset when it goes below the value $C_{release}$. The hysteresis implies that the release distance is larger than the proximity detection distance, and is useful to avoid noise-induced transitions and multiple edges. High sensitivity, and a good signal to noise ratio are important. The threshold and hysteresis levels may be adaptable by the proximity processor or by the host system, and other more advanced discrimination schemas may also be possible.

FIG. 6 relates to an arrangement known in the prior art with a mobile device that includes a central processing unit (indicated as 'host' 100) that communicates with other devices by means of a radiofrequency unit 57 (RF) and a suitable RF antenna 50. We may consider, to fix the ideas, that the mobile device is a cellular phone using any of the UHF bands assigned for cellular phone use, for example the GSM frequencies (850/900/1,800/1,900 MHz). The invention, however, is not limited to this particular interface, and may include also other mobile devices like for example Wi-Fi mobile devices, like laptops or tablets, or any other mobile radio device.

It is a common problem with portable radio devices, that the Specific Absorption Ratio (SAR) of radiofrequency energy should not exceed certain regulatory limits. A proximity detector is then used to determine when the device is brought close to a body part, and in this case reduce the emitted power to comply with the SAR limit, while resuming transmission at full power when the device detects no body parts in proximity. FIG. 6 presents a typical arrangement in which the antenna is close to a proximity sensor 60, in fact a capacitive electrode, connected to a suitable discrimination and processing circuit 80 sensitive to the minute changes in capacitance of the sensor occurring when a body part is near, and capable of delivering a proximity signal (Prox/Release) to the host circuit, based on said capacitance changes. The proximity sensor circuit 80 might have the structure of FIG. 3 and could be embodied in a specialized integrated circuit, be part of an integrated circuit that takes care of other functions as well, or be realized by a combination of integrated circuits and discrete components. In turn, the host device can pilot the RF circuit 57 and adapt the RF power according to whether a body part is in proximity or not. In this manner, the proximity detector assure compliance with the regulatory SAR limits while preserving connectivity, since the power is reduced only when necessary. This realization is similar to that of a touch button, and the sensor may be any suitable piece of conductor (metal plate, PCB pad, FPC pad, etc.) connected only to the proximity processing circuit 80.

A drawback of this solution is that the separate electrode necessarily takes some space, which is always a scarce resource in modern mobile devices, and also that the proximity sensor is quite omnidirectional, incapable of distinguishing the direction from which the body part approaches.

FIG. 7 shows another disposition in which the RF antenna 50 doubles as detection electrode for the proximity processor 80, and economizes the surface that a dedicated electrode would have taken. In this variant, the antenna is connected both to the radio unit 57 (RF) and to the proximity processor 80. The antenna itself, it has been found, generally has a sufficient surface to provide a suitable capacitance signal, and the separation between the UHF radio signals and the capacitance variation, which are in the low-frequency end of the spectrum, is obtained by a capacitive coupling between the antenna and the RF front-end, and an inductive coupling to the proximity processor, as shown.

While the disposition of FIG. 7 reduces the space required, still the detection is unidirectional. The detection distance must be fixed very high, taking the worst case into account, and the power is reduced when the user approaches from any direction, including those where the SAR level is low.

Since the emission of radiofrequency from the antenna is not uniform, but tends to be stronger in some parts, and weaker in others, it is advantageous, in term of SAR compliance and RF performances, to reduce the power more readily when a body parts approaches from the parts in which the emission is strong, rather than from parts in which the emission is weak. This can be achieved by a proximity detector capable of delivering some form of information on the direction of approach, or whose sensitivity matches the emission distribution of the antenna.

FIG. 8 shows an inventive disposition in which the antenna is split in two segments 50 and 60. The segments are connected together by a capacitor whose value is chosen such that for the radio signal it is essentially a short circuit yet, the capacitive proximity detector 80 can read the capacitance of the two segments, or the variations thereof, separately. In practice, for GSM antennas in the 900 MHz band and in all relevant use cases, this can be accomplished by inserting capacities of the order of 100 pF, without changing the RF performance. The proximity circuit is generally arranged to detect the approach of a body part from an increase of the observed capacitance of an electrode and, therefore, the constant contribution of the neighboring electrodes is not detrimental to their function.

In the presented example, two sections of the antenna 50 and 60 are connected to a multichannel proximity detector 80 with two inputs IN0 and IN1, which yields a multi-valued signal (ProxH/ProxL/Release) according to whether the approach is detected from the two, one or no electrodes. Preferably, the channels of the proximity detector have different sensitivities, such that the detection distance can be fixed differently for each section: the right section (High distance) is connected to a high sensitivity channel, and the left section (Low distance) to a channel of lower sensitivity. The host system can decide different levels of power reduction according to which section has detected a proximity (High attenuation/Medium attenuation/No attenuation).

The invention is not limited to the case of two sections and two channels, however, and could well include realization in which the antenna is split in a larger number of channels, and the processing algorithm implemented in the proximity detector 80 is more sophisticated.

Other applications include proximity/touch gesture recognition, left-right hand recognition, detecting whether the device is laying on a table, and so on.

FIG. 9 illustrates a realization of the inventive concept in a folded quarter-wave antenna for the 900 MHz GSM band, in the PIFA (Planar Inverted F Antenna) configuration. The RF signal it fed at feed point 131 and the antenna is split in two sections 50 and 60 by the capacitors 132 and 137, which may have a value of about 150 pF. One inductor 135 for connection to the capacitive sensor 80 is indicated. Simulations of the RF performances show no degradation compared to the case of a conventional antenna.

Figure 10:
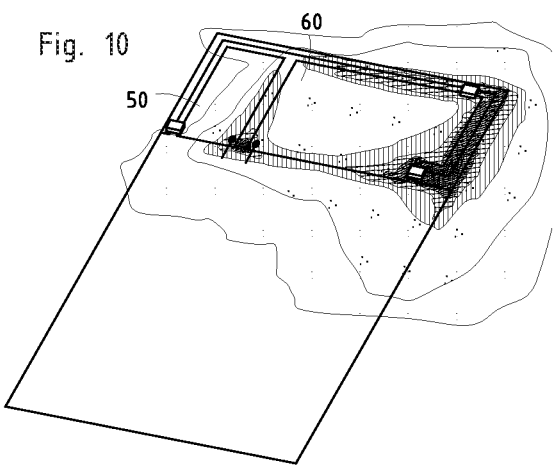

FIG. 10 is a plot of the electric field emitted by the antenna of FIG. 9. Since the field is more intense at the right side, a proximity sensor that can discriminate body parts approaching from the right from body parts approaching from other directions is advantageous, and provides an optimal control of the RF intensity. The segmented antennas and multi-channel proximity detector of the present invention can deliver this discrimination.

Figure 11:
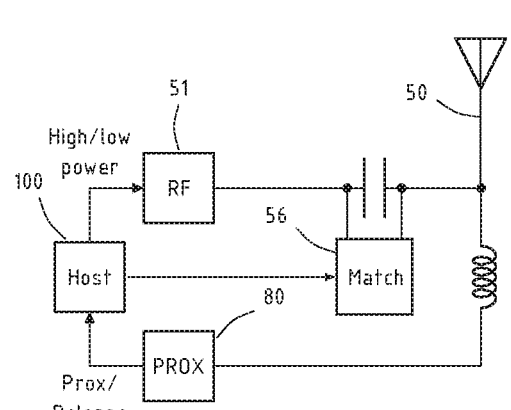
FIG. 11 illustrates schematically a system with a dynamic RF matching circuit.

FIG. 11 shows a system comprising a RF matching circuit 56 that is used to optimize the coupling between the radio unit 57 and the antenna 50. This is typically achieved by switching discrete or integrated capacitors directly attached to the RF path. When the antenna is also used as a capacitive proximity sensor, these changes in the DC capacitance can interfere with the user's detection and create false triggers, unwanted detections or releases.

Figure 13:
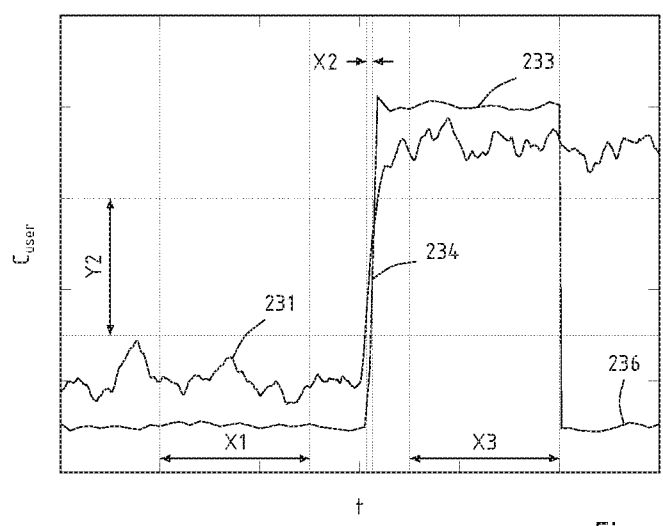
FIG. 13 plots an electronically-induced capacitance change compared to a genuine proximity event, and illustrates a pulse suppression method.

Preferably the invention uses a step cancellation algorithm as will be now described referring to FIG. 13. In order to avoid false triggers. This exploits the fact that a capacitance change due to dynamic RF matching (curve 233) will be abrupt and almost instantaneous (step 234), while the same change created by the user's motion (curve 231) is necessarily more progressive. Moreover, when the user moves or the telephone is moved, the capacitance $C_{user}$ will be unsteady for some time before and after the trigger.

According to an aspect of the invention, the proximity detector monitors the capacitance signal and, if the capacitance shows a step-like transition, determines whether the RF match circuit 56 has intervened. This can be achieved based on the shape of the capacitance signal, and in particular based on the steepness of the transition and on the variability, or statistic dispersion, of the signal before and after the transition.

In a possible implementation, a sliding window analysis monitors the signal and rejects steps whose transition speed is above a given value. Preferably, the step cancellation algorithm recognizes the unwanted events by the following three criteria, possibly combined together by a logical and.
1) A steady baseline before the step, for example detected by applying an upper threshold to the dispersion of a given depth X1 of samples before the step;
2) A sharp change, for example detected by applying a lower threshold to the slope, e.g. a change of at least Y2 codes within an interval X2 of samples;
3) A steady baseline after the step, for example detected by applying an upper threshold to the dispersion of a given depth X3 of samples after the step 234.

When detected, the step is immediately cancelled by applying a correction corresponding to the step size, hence restoring the signal $C_{user}$ to its original value 236 after a short time interval. This could be obtained, in the circuit of FIG. 4, by the offset correction unit 50. The step cancellation described above could be carried out in the host system 100 or, preferably, in the proximity sensor circuit 80.

The invention claimed is:

1. A proximity sensor for detecting proximity of a body portion to a mobile device, comprising:
    a plurality of capacitive sensing electrodes for detecting said body portion,
    an electronic processing circuit arranged for measuring the capacities of said capacitive sensing electrodes and for generating a proximity signal based on the capacities so measured, wherein the capacitive sensing electrodes are connected together by one or more capacitive elements, and at least one capacitive sensing electrode is connectable to a radio circuit of said mobile device so as to constitute a radiofrequency antenna of said mobile device, wherein the electronic processing circuit has two channels connected to two sensing electrodes and wherein the channels have different sensitivities, wherein the electronic processing circuit is arranged to reject events characterized by a change of the capacitance seen by any one of the capacitive sensing electrodes with a speed exceeding a given threshold value.

2. The proximity sensor of claim 1, wherein the capacitive sensing electrodes are connected to said electronic processing circuit by inductive elements.

3. The proximity sensor of claim 1, wherein the electronic processing circuit is arranged to accept events characterized by a change of the capacitance seen by any one of the capacitive sensing electrodes from a first essentially constant value to a second essentially constant value.

4. The proximity sensor of claim 1, wherein the electronic processing circuit is arranged to generate a proximity value based on a weighted sum of the capacities, or of the variations of capacitance measured from the capacitive sensing electrodes.

5. The proximity sensor of claim 1, wherein the electronic processing circuit is arranged to generate a directional proximity value based on the capacities, or of the variations of capacitance measured from the capacitive sensing electrodes.

6. In a mobile device, the proximity sensor of claim 1 in combination with a radio unit connected to a radiofrequency antenna for receiving and/or transmitting radio signal, the capacitive sensing electrode or electrodes of the proximity sensor constituting the radiofrequency antenna.

7. The mobile device of claim 6, wherein the multichannel proximity sensor has a plurality of capacitance inputs, each capacitance input being inductively coupled to a section of the radiofrequency antenna.

8. The mobile device of claim 7, wherein the radio unit is arranged to communicate in the UHF spectrum, in particular in a band of the UHF spectrum assigned to cellular phone services, Fi-Fi, or Bluetooth.

9. The mobile device of claim 8, wherein the sections of the antenna are conductive areas laminated on an insulating circuit board.

10. A proximity sensor for detecting proximity of a body portion to a mobile device, comprising:
    at least one capacitive sensing electrode for detecting said body portion,
    an electronic processing circuit arranged for measuring the capacities of said at least one capacitive sensing electrode and for generating a proximity signal based on the capacities so measured, wherein electronic processing circuit is arranged to reject events in which the capacitance seen by the at least one capacitive sensing electrode changes with a speed exceeding a given threshold value.

11. The proximity sensor of claim 10, wherein the electronic processing circuit is arranged to accept events characterized by a change of the capacitance seen by the at least one capacitive sensing electrode from a first essentially constant value to a second essentially constant value.

12. The proximity sensor of claim 10, comprising a plurality of capacitive sensing electrodes for detecting said body portion, connected together by one or more capacitive elements said electronic processing circuit being arranged for measuring the capacities of said capacitive sensing electrodes and for generating a proximity signal based on the capacities so measured, wherein at least one capacitive sensing electrode is connectable to a radio circuit of said mobile device so as to constitute a radiofrequency antenna of said mobile device and the radio circuit includes an RF matching circuit.

* * * * *